United States Patent [19]
Storey et al.

[11] Patent Number: 5,748,017
[45] Date of Patent: May 5, 1998

[54] METHOD AND APPARATUS FOR DETERMINING LINEARITY OF A RAMP SIGNAL

[75] Inventors: Michael C. Storey, Garland; Lawane Luckett, Richardson, both of Tex.

[73] Assignee: Texas Instruments Incorporated, Dallas, Tex.

[21] Appl. No.: 684,532

[22] Filed: Jul. 19, 1996

[51] Int. Cl.$^6$ .................................. H03K 4/08
[52] U.S. Cl. ................ 327/131; 327/133; 327/134; 327/135
[58] Field of Search .................. 327/13–15, 131, 327/133–137, 170

[56] References Cited

U.S. PATENT DOCUMENTS

| | | | |
|---|---|---|---|
| 3,735,261 | 5/1973 | Vahlstrom et al. | 327/14 |
| 4,855,968 | 8/1989 | Shank | 368/115 |
| 4,908,784 | 3/1990 | Box et al. | 364/569 |
| 4,982,350 | 1/1991 | Perna et al. | 364/569 |
| 5,283,515 | 2/1994 | Jordan | 323/288 |
| 5,347,176 | 9/1994 | Bloom | 307/490 |

OTHER PUBLICATIONS

Rettig, John B., "Picosecond Time Interval Measurements," IEEE Transactions on Instrumentation and Measurement vol. 44, No. 2, Apr. 1995, pp. 284–287.

*Primary Examiner*—Timothy P. Callahan
*Assistant Examiner*—T. T. Lam
*Attorney, Agent, or Firm*—Robert L. Troike; Wade James Brady, III; Richard L. Donaldson

[57] ABSTRACT

An improved system and method of determining the linearity of a ramp signal, including a ramp generator (11) for generating a ramp signal and a vernier delay (15) to provide scan stop signals where the samples are peak detected (17) and stored (21). The ramp generator (11) outputs are divided into equal sections controlled by a precise crystal controlled oscillator (25). The stored signals are processed and compared to detect errors.

5 Claims, 3 Drawing Sheets

METHOD AND APPARATUS FOR DETERMINING LINEARITY OF A RAMP SIGNAL

TECHNICAL FIELD OF THE INVENTION

This invention relates to measurement systems and methods and more particularly to system and method for determining the linearity of a voltage ramp signal.

BACKGROUND OF THE INVENTION

Linear voltage ramp signals are commonly used for delay verniers and time measurement units. For these applications, the voltage ramp linearity is very critical. It is especially critical for time measurement units applications because of the need for precise time measurement.

In a time measurement unit application, the linear ramp signal is started and stopped by a pair of signals. The time difference between these two signals corresponds to the time interval under measurement. The voltage level that the ramp signal rises to is a function of the ramp dv/dt and the time difference ($\Delta t$) between the start and stop signals. This level can be calculated using the basic equation: Voltage=(dv/dt)($\Delta t$).

When performing a time measurement, the voltage that results from any pair of start and stop signals is measured, the measured voltage is converted to time by rearranging the basic equation and inserting the known values of dv/dt and measured voltage. The rearranged equation is: $\Delta t$=Voltage/(dv/dt).

Referring to FIG. 1 there is shown the major types of errors found in generating these ramp signals. For example, for trace A it is the embedded ringing effect which occurs at the beginning of the ramp signal. Another major error is in the trace B which has knees therein giving non-linear functions. Another factor can be exponential charging/decaying as represented by trace C.

The most common method used to evaluate the linearity of a ramp signal requires a precision time interval generator. The generator is used as a reference for each measured point on the ramp signal. This method, while good for long time intervals, is impractical for sub-nanosecond intervals because of the inherent error within the interval generator.

This method is illustrated in FIG. 2. In each of the three tests, the time interval generator is used to first start the ramp signal and second to stop the ramp signal at some later point in time. During the time between the start and stop signals, the ramp signal rises to a value corresponding to the time difference between the generator's start and stop signals. At each of the points between the intervals of P1, P2, and P3 the ramp voltage is measured. The slope (dv/dt) of the ramp is calculated and compared to the expected value. On the ramp shown in FIG. 2, there is a distortion (error) in the ramp between points P1 and P2. Since this distortion is not one of the measured points, it can not be detected.

If the region of distortion spans only a few pico-seconds of time, it becomes impossible to detect, using any available time marker. If a time measurement occurs within the area of distortion, the results will be incorrect.

SUMMARY OF THE INVENTION

In accordance with one embodiment of the present invention, the voltage ramp signal is essentially divided into multiple sections. Each section spans a known time interval. Each section of the ramp signal is scanned using a vernier delay to sweep the entire section and data of each section is stored. A comparison is made between the gain factors and the offset factors of each section. The gain factors will be identical for a perfectly straight ramp signal and if the gain factors are not identical this will indicate an error.

These and other features of the invention that will be apparent to those skilled in the art from the following detailed description of the invention, taken together with the accompanying drawings.

DESCRIPTION OF THE INVENTION PREFERRED EMBODIMENT OF THE PRESENT INVENTION

Figure 1:
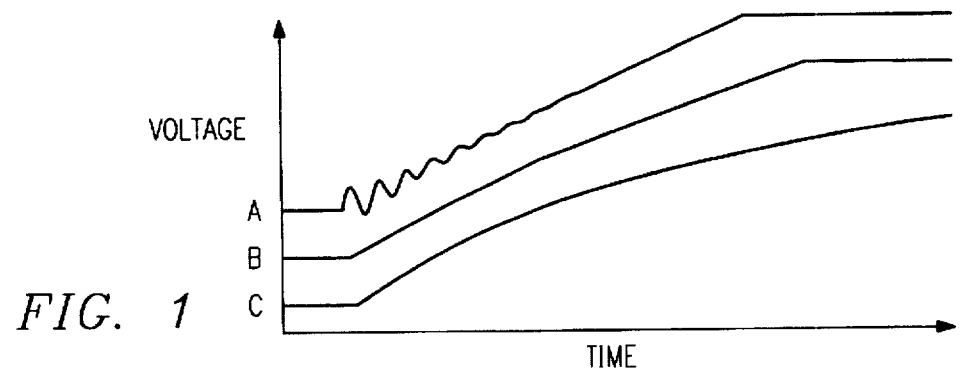
FIG. 1 illustrates major types of errors found in voltage ramp signals.
Figure 2:
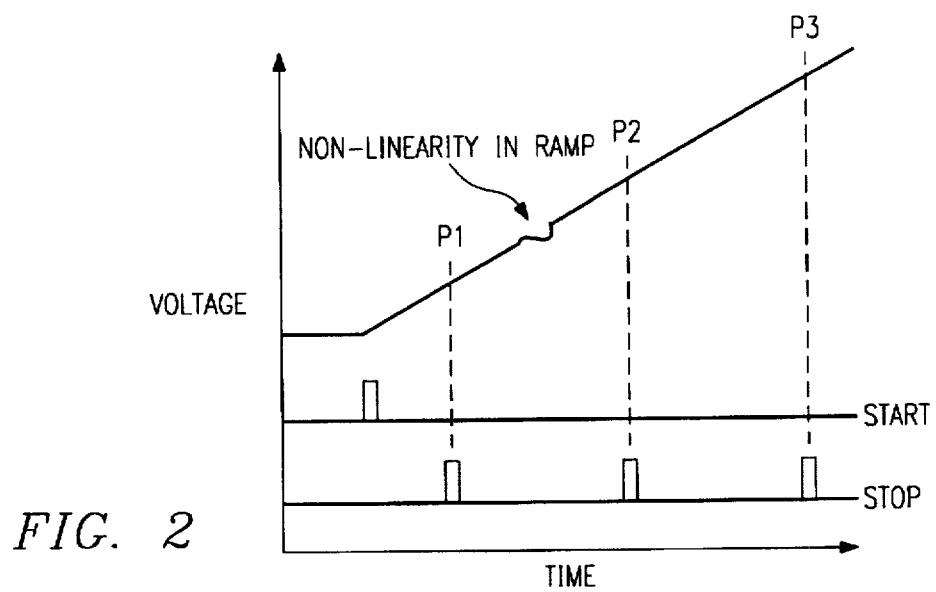
FIG. 2 illustrates a distortion error in a voltage ramp signal between points P1 and P2.
Figure 3:
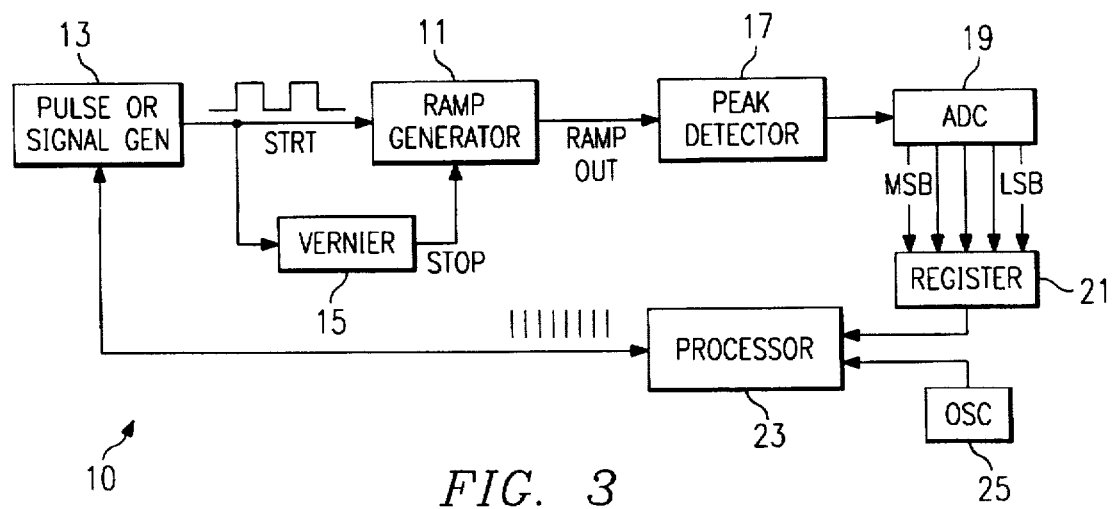
FIG. 3 is a block diagram of the system in accordinance with one embodiment of the present invention.
Figure 4:
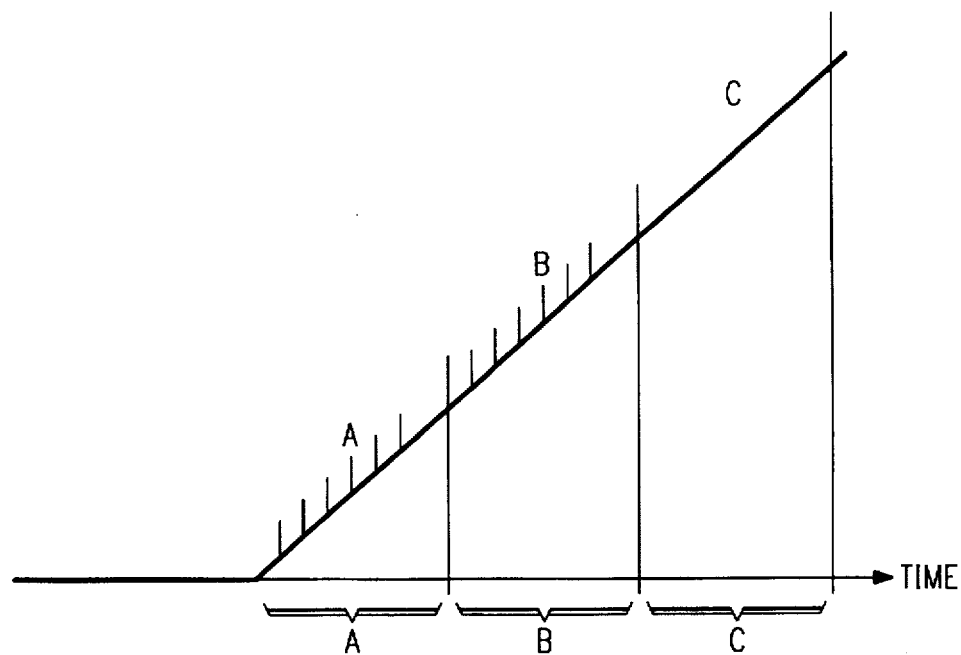
FIG. 4 illustrates the operation of the system in accordance with one embodiment of the present invention of FIG. 3.
Figure 5:
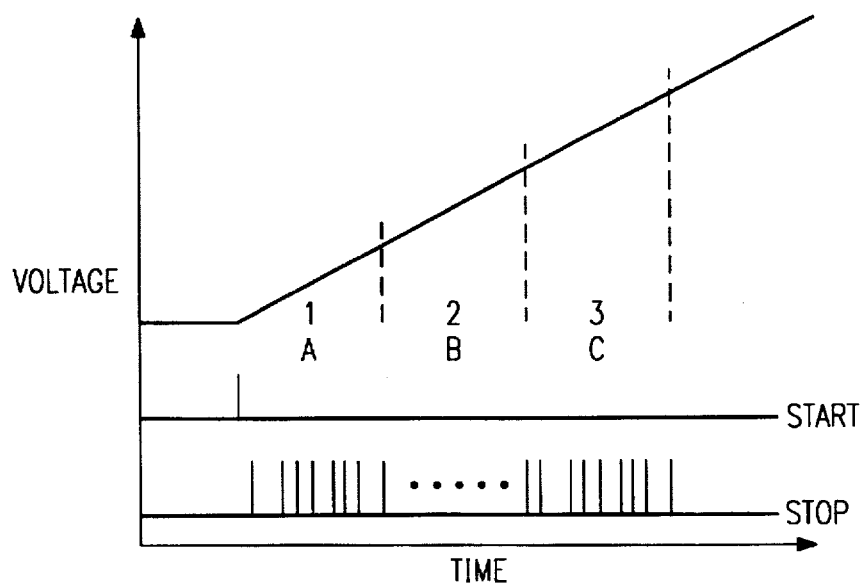
FIG. 5 illustrates the sweeping process associated with verniers.
Figure 6:
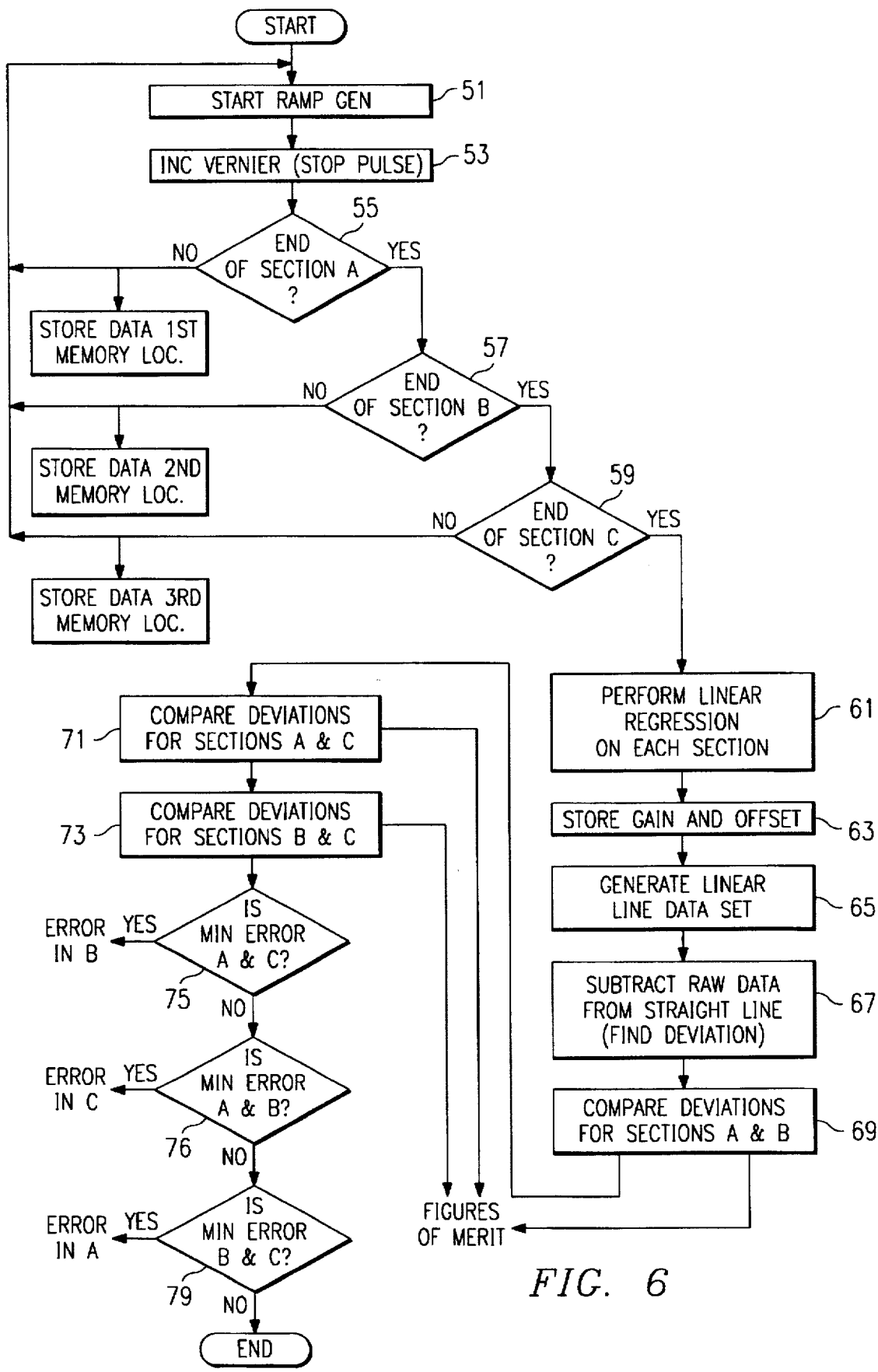
FIG. 6 is a flow chart illustrating the operation of a processor.

Referring to FIG. 3 there is illustrated a voltage ramp generator 11 and a testing system 10 in accordance with one embodiment of the present invention. The ramp generator 11 is started by pulse generator 13 providing periodic signal pulses to the voltage ramp generator 11. The pulse generator 13 also provides a signal pulse to a programmable vernier delay 15, which then provides a stop signal to the ramp generator after a predetermined delay established by desired number of samples. The programmable vernier delay may be coupled to either the start and/or stop signal path to provide a sweep function during evalution or calibration of the ramp signal. The peak voltage output level at the ramp generator 11 when the stop signal is received is peak detected in detector 17. This peak voltage level is converted by analog to digital converter (ADC) 19 to provide a binary representation of that peak level with most significant bits (MSB) and least significant bits (LSB). The binary representation of the peak level at converter 19 is stored in storage 21 for comparison. The pulse generator 13 is coupled to and controlled by a processor 23. The processor 23 is also coupled to the storage 21 for controlling the storage and retrieving the binary representations of the peak detected signals. The processor 23 also selects sections of the ramp signal and does the comparison between sections. The ramp signal is divided into, for example, three sections as represented by sections as represented by sections A, B, and C in FIG. 4. The process of sweeping these sections is illustrated in FIG. 5. Note that the stop signals contain non-linear spacing. This non-linear spacing is typical of the type of errors associated with the programmable verniers. This error is eliminated by this system and method. This system under processor control is operated according to the flow chart of FIG. 6.

In step 51 the ramp signal is generated and periodically the delayed vernier stop pulses are provided (step 53) and if it is determined that it is not the end of the first section A ("no" at step 55) the voltage level is peak detected at peak detector 17, converted to binary at converter 19 and stored in storage 21 in a first memory location for section A. This process continues for all raw data reading for section A. When a crystal controlled oscillator timer 25 coupled to the processor 23 determines the time period of section A is ended ("yes" at block 55) the raw data samples are stored ("no" at block 57) in a second memory location for section B. Similarly when the oscillator determines the time period of Section B has ended ("yes" at block 57) the raw data samples for section C are stored in a third data location in storage 21. The time periods of sections A, B, and C are equal as controlled by the crystal controlled oscillator 25.

When it is determined that section C is over ("yes" at block 59) linear regression is performed by the processor 23 (block 61) with the raw data from the memory 21 to provide and store, (block 63) gain, and offset factors in memory for each section (A, B, and C) of the ramp.

For each section (A, B, and C) of the ramp, using the corresponding gain and offset factors, a linear line data set is generated (Block 65) using the equation for a straight line of Y=Mx+B where M is the slope or gain and B is the offset.

In step 67, for each section (A, B, and C) of the ramp, the raw data (stored in memory 21) is subtracted from the straight line data (point by point from step 65). This produces a data set, for each ramp section A, B, or C that contains the sum of the ramp errors (deviations) plus any error due to the vernier. Each point in the data sets can be expressed as: $R_x+E_v$.

where $R_x$ is the ramp value and $E_v$ is the error from the vernier. Each error data set is normalized to the same value (usually zero).

The error set for each ramp section (A, B, or C in FIG. 4) is compared (Step 69) to all other error sets (point by point) by performing subtraction as shown in the following equation:

$$\text{RAMP DIFFERENCE for sections A and B} = (R_A+E_v)-(R_B+E_v) = R_A+E_v-R_B-E_v = R_A-R_B$$

RAMP DIFFERENCE now contains any error introduced by the ramp. For an ideal ramp, RAMP DIFFERENCE is equal to zero.

The resulting RAMP DIFFERENCE data sets, for all combinations of ramp sections (A, B, C), are evaluated for maximum and minimum values to establish the "figure-of merit" or error contribution of the ramp.

This comparison is done by comparing (Step 69) sections A and B to determine and store a figure of merit for this comparison, by comparing (Step 71) Section A and C to determine and store a second figure of merit for this comparison, and by comparing (Step 73) Sections B and C to determine and store a third figure of merit. Steps 75–77 then compare these to determine where the greater error occurs. If they are all zeros, then there is complete linearity but where there is the greatest difference there is the greatest error.

OTHER EMBODIMENTS

Although the present invention and its advantages have been described in detail, it should be understood that various changes, substitutions and alterations can be made herein without departing from the spirit and scope of the invention as defined by the appended claims.

What is claimed is:

1. A method for determining the linearity of a ramp signal comprising the steps of:

sampling signal level values of a plurality of equal time sections of the ramp signal using a vernier delay to sweep the entire section;

storing said signal level values;

generating a data set for each section of said plurality of equal time sections that contains ramp error and vernier delay error; and comparing said data set for each section of said plurality of equal time sections to said data set for the other equal time sections of the ramp signal to determine ramp differences to determine ramp error.

2. The method of claim 1 wherein the generating step includes the steps of:

performing linear regression for signal level values for each section producing both gain and offset factors for each section of ramp signal; and using corresponding gain and offset factors generating a linear line data set using the equation of a straight line being Y=MX+B where M is the slope or the gain and B is the offset.

3. The method of claim 2 wherein the generating step further includes the step of:

for each section of the ramp signal, subtracting said stored signal level values from the generated linear line data set, point by point, to produce said data set for each ramp section that contains the sum of the ramp errors plus any error due to said vernier delay, wherein each point in the data set can be expressed by $R_x+E_v$, where $R_x$ is a ramp value and $E_v$ is the error from said vernier delay.

4. The method of claim 3 wherein the comparison step includes performance subtraction according to the following equation:

$$\text{RAMP DIFFERENCE} = (R_1+E_v)-(R_2+E_v) = R_1+E_v-R_2-E_v = R_1-R_2,$$

where $R_1$ is the ramp value for a first section and $R_2$ is the ramp value for a second section.

5. The method of claim 4 including evaluating the resulting ramp difference for all combinations of ramp sections for establishing a figure of merit or error contribution.

* * * * *